(12) United States Patent
Hirsch et al.

(10) Patent No.: US 10,408,895 B2
(45) Date of Patent: Sep. 10, 2019

(54) POLARIZATION SAMPLE GEOMETRY

(71) Applicant: Bruker Biospin Corporation, Billerica, MA (US)

(72) Inventors: Matthew Hirsch, Stoneham, MA (US); Avrum Belzer, Brookline, MA (US); Neal Kalechofsky, Stow, MA (US); Charles Monroe, Gloucestershire (GB)

(73) Assignees: Bruker Biospin Corporation, Billerica, MA (US); Millikelvin Technologies LLC, Braintree, MA (US)

( * ) Notice: Subject to any disclaimer, the term of this patent is extended or adjusted under 35 U.S.C. 154(b) by 1121 days.

(21) Appl. No.: 14/212,695

(22) Filed: Mar. 14, 2014

(65) Prior Publication Data

US 2014/0263359 A1 Sep. 18, 2014

Related U.S. Application Data

(60) Provisional application No. 61/791,452, filed on Mar. 15, 2013.

(51) Int. Cl.
*G01R 33/20* (2006.01)
*G01R 33/28* (2006.01)

(52) U.S. Cl.
CPC .................................. *G01R 33/282* (2013.01)

(58) Field of Classification Search
CPC ...... G01R 33/282; G01R 33/20; G01R 33/28; G01R 33/30; G01R 33/307; G01R 33/44; G01R 33/46; G01R 33/465; G01R 33/50
USPC ................. 435/287.1, 287.3, 288.1; 436/73; 324/301–322; 428/35.7, 36.9, 36.91, 428/36.92; 220/560.04–560.15; 73/864.91

See application file for complete search history.

(56) References Cited

U.S. PATENT DOCUMENTS

| | | | | |
|---|---|---|---|---|
| 4,030,844 A | * | 6/1977 | Lench | A45D 34/041 401/213 |
| 6,237,363 B1 | * | 5/2001 | Zollinger | A61K 49/1815 600/420 |
| 2002/0094317 A1 | * | 7/2002 | Pines | A61K 49/1815 424/9.3 |
| 2003/0049218 A1 | * | 3/2003 | Patel | A61K 8/0208 424/65 |

(Continued)

OTHER PUBLICATIONS

Tiwali et al., Advanced Surface Engineering Materials. Hoboken: Scrivener, 2016.*

*Primary Examiner* — Lee E Sanderson
(74) *Attorney, Agent, or Firm* — O'Shea Getz P.C.

(57) ABSTRACT

A carrier for a sample of highly polarized material includes a shell having a radially exterior surface and a radially interior surface, and a sample of highly polarized material interiorly adjacent to the radially interior surface. The shell may be substantially cylindrical, and may be constructed from a magnetic or non-magnetic material. The sample of highly polarized material may comprise a methyl rotor group material. The sample of highly polarized material may comprise pyruvic acid or an acetic acid. The sample of highly polarized material may be co-axial with the cylindrical shell. The sample of highly polarized material may be bonded or frozen to the radially interior surface of the shell. The carrier may further comprise a wad of material that forms a volume and contacts an axially proximate end of at least one of the shell or the sample.

13 Claims, 3 Drawing Sheets

(56) References Cited

U.S. PATENT DOCUMENTS

| | | | |
|---|---|---|---|
| 2005/0235693 A1* | 10/2005 | Hersman | A61K 49/1815 |
| | | | 62/601 |
| 2008/0240998 A1* | 10/2008 | Urbahn | G01N 13/00 |
| | | | 422/400 |
| 2011/0008261 A1* | 1/2011 | Lerche | A61K 49/10 |
| | | | 424/9.3 |
| 2011/0062392 A1 | 3/2011 | Kalechofsky et al. | |
| 2011/0095759 A1* | 4/2011 | Bhattacharya | A61B 5/055 |
| | | | 324/307 |
| 2011/0243855 A1* | 10/2011 | Gisselsson | A61K 49/10 |
| | | | 424/9.3 |
| 2011/0274477 A1* | 11/2011 | Nakatani | B43K 1/08 |
| | | | 401/147 |
| 2012/0117985 A1* | 5/2012 | Urbahn | G01N 13/00 |
| | | | 62/45.1 |

* cited by examiner

POLARIZATION SAMPLE GEOMETRY

PRIORITY INFORMATION

This patent application claims priority from U.S. provisional patent application Ser. No. 61/791,452 filed Mar. 15, 2013, which is hereby incorporated by reference.

FIELD OF TECHNOLOGY

The invention relates to improved techniques, methods and systems for expelling a sample from a cryogenic environment. This has particular application in the field of hyperpolarization, where controlled expulsion from very cold environments is necessary to preserve the polarization of spins in the sample.

RELATED ART

Current commercial polarizers typically utilize cryogenic temperatures, but do not expel samples in the solid state. Rather, they melt the polarized material inside the polarizing cryostat, typically via the use of superheated hot water or buffered liquids, and then eject the resulting solution. This approach has the significant drawback that the hyperpolarized solution must be employed immediately in an NMR/MRI/MRS study because, once in the liquid state, polarizations do not typically last more than a minute or two.

U.S. Patent Application Publication 2011/0062392 entitled "Systems and Methods For Producing Hyperpolarized Materials and Mixtures Thereof", which is hereby incorporated by reference, describes methods for producing highly polarized materials, solutions, etc., with an embodiment that the material is polarized in a polarizing cryostat and then expelled in the solid state.

As disclosed in that published patent application, polarized materials can be removed from the polarizing environment, in the solid state and without undue loss of polarization, if magnetic field and temperature conditions during removal are carefully controlled. In one particular application, a fluid or gas stream can be used to rapidly expel the sample from the polarizing cryostat and reduce or minimize the exposure time of the sample to uncontrolled temperatures and/or low magnetic fields. This is important because polarization loss mechanisms under such conditions, particularly that of low ambient magnetic field and non-cryogenic temperatures, can become much faster.

This is particularly true if the polarized material is a molecule that contains one or more methyl rotor groups (MRG). MRG are described in the prior art and it is known that they can produce rapid nuclear magnetic relaxation in specific temperature ranges. In these temperature regions, relaxation rates can be fast even at high ambient magnetic fields and moreover can become even faster if the ambient field is low. These temperature ranges are known in the art as the "Valleys of Death". At temperatures above or below the valley, relaxation rates are typically much longer, and sample handling consequently much easier. Hence, for materials containing MRG it is important that conditions of sample expulsion, handling, storage and transport be conducted in a manner that reduces or minimizes exposure of the sample to temperature regions where relaxation is very fast.

In order to facilitate the expulsion and subsequent handling of the polarizing material, in particular materials containing one or more MRG, U.S. Patent Application Publication 2011/0062392 teaches the use of first pelletizing the material to be polarized. This can be accomplished in a number of ways, most notably when the material is a liquid at STP conditions, it can be frozen into a pellet by application of a cryogenic liquid such as liquid nitrogen. This produces a solid pellet of material that can be rapidly moved in/out of cryostats, for example using gas pressure.

However in actual practice, it has been found that the pellet itself is often fragile. At the relatively high velocities employed during sample expulsion the pellet often becomes powderized via collision with the walls of the tube in which it was travelling. This leads to significant sample loss as powder sticks to the inside of the tube and is hence lost. Moreover a solid pellet requires a relatively long time to warm; this can be disadvantageous when attempting to quickly warm the pellet through one or more of the above described "Valleys of Death". Finally, a solid pellet takes a relatively long time to melt; this is undesirable since it can lead to undue polarization loss as well.

Thus, there is a need in the art for a technique of preparing samples so that they can be expelled in the solid state from polarizing cryostats, where in addition:

1) the amount of sample can be carefully controlled;
2) the ability to quickly equilibrate to ultra-low temperature may be enhanced by variable geometry of the sample;
3) they can be moved with ease in/out of cryogenic environments without damage to the sample;
4) their exposure time to different fields and temperatures, in particular low field and/or temperature ranges where polarization loss can be relatively rapid, can be reduced or minimized;
5) their internal temperatures can be rapidly adjusted, during or following ejection from the cryogenic environment; and
6) their melting time when exposed to a warm liquid and or buffered solution can be reduced or minimized.

There is a need for a system and method of expelling a sample in the solid state, such that polarization gained in the cryostat can last longer (e.g., many orders of magnitude longer) when removed from the cryostat. This would allow the sample to be stored and/or transported so that the polarizing cryostat can now be located remotely from the site(s) of use.

SUMMARY OF THE INVENTION

A carrier for a sample of highly polarized material includes a shell having a radially exterior surface and a radially interior surface, and a sample of highly polarized material interiorly adjacent to the radially interior surface.

The shell may be substantially cylindrical, and may be constructed from a magnetic or non-magnetic material. For example, the shell may be a plastic material such as for example a polycarbonate or a Ertalyte PET-P. An example of a magnetic material is stainless steel.

The sample of highly polarized may comprise a methyl rotor group material. The sample of highly polarized may comprise pyruvic acid or an acetic acid.

The sample of highly polarized material may be co-axial with the cylindrical shell. The sample of highly polarized material may be bonded or frozen to the radially interior surface of the shell.

The carrier may further comprise a wad of material that forms a volume and contacts an axially proximate end of at least one of the shell or the sample. For example, the wad may comprise a hollow or solid sphere, made of a lightweight material such as for example Teflon. The wad may have a cross sectional area taken along the axial direction of the shell that is larger than the shell cross sectional area and the sample cross sectional area taken along the axial direction.

These and other objects, features and advantages of the present invention will become apparent in light of the detailed description of the embodiments thereof, as illustrated in the accompanying drawings. In the figures, like reference numerals designate corresponding parts or steps.

DESCRIPTION

In one embodiment, a method of freezing a liquid sample in an annular layer to the inside of a shell (i.e., "shuttle") is disclosed. The sample may be deoxygenated.

Figure 1:
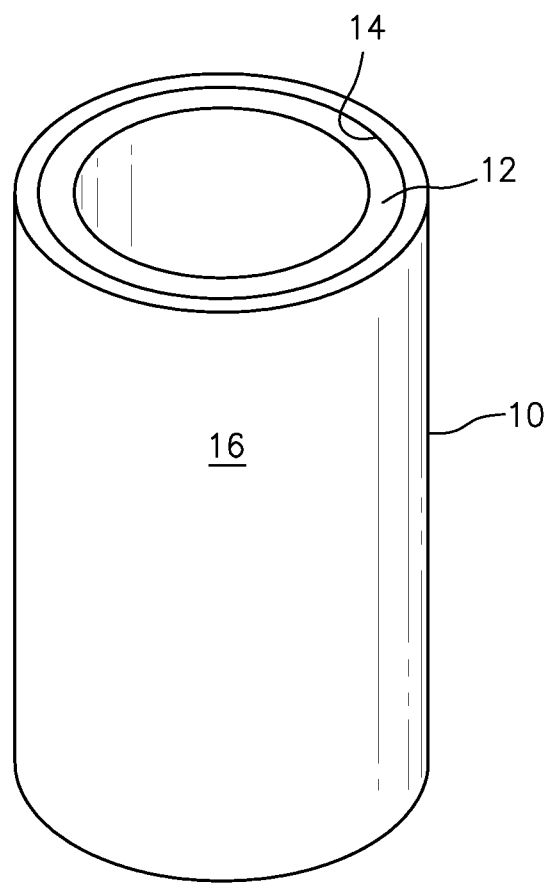
FIG. 1 illustrates a shell that comprises a frozen sample.

FIG. 1 illustrates a carrier that comprises a shell (i.e., a shuttle) 10 and a frozen sample 12. The shell may include a radially interior surface 14 and a radially exterior surface 16. A thin annular layer of the sample 12 is frozen to the radially interior surface of the shell 10 (e.g., cylindrical). The shell may be substantially cylindrical, and may be constructed of magnetic or non-magnetic material. For example, the shell may be a plastic material, such as for example, a polycarbonate or a Ertalyte PET-P. An example of a magnetic material is stainless steel. The shell provides mechanical support for the sample as well as good thermal contact to a material whose temperature can be rapidly adjusted as needed. The sample volume itself is adjustable via the choice of a centering pin in a mold to be discussed below, including to the extreme of absent pin and complete filling.

Figure 2:
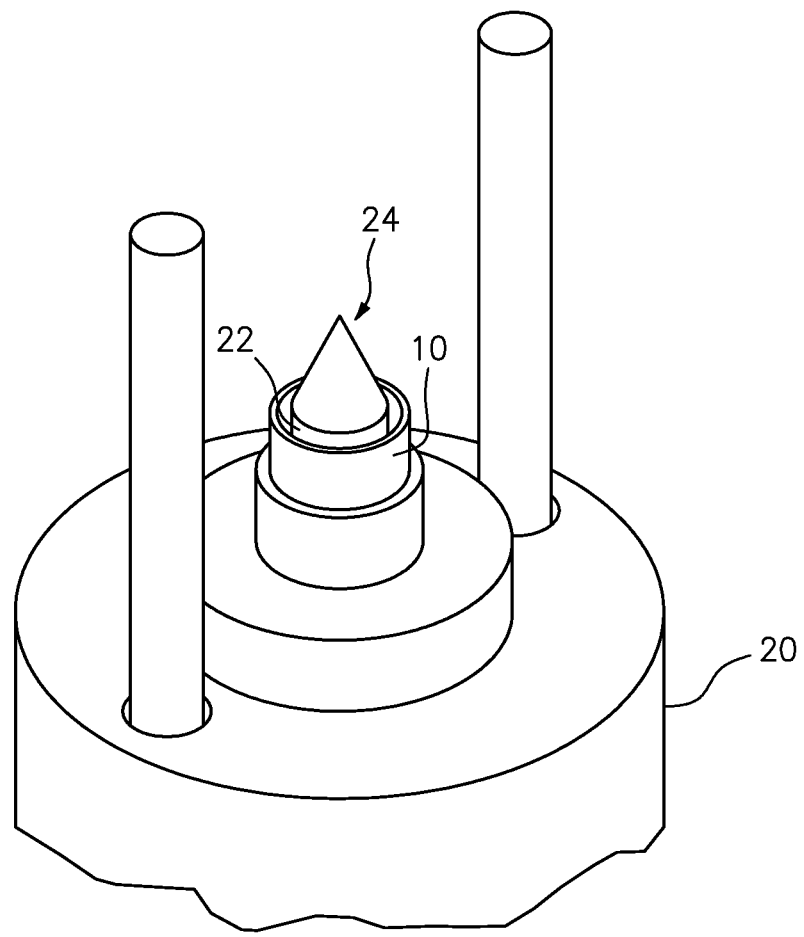
FIG. 2 illustrates a mold that produces a thin annular region of frozen sample along an interior wall of the shell.

FIG. 2 illustrates a mold 20 that may be used to produce a thin annular region of frozen sample within the shell, wherein thickness of the annular frozen layer inside the shell can be controlled using the mold. Liquid sample 22 is placed in the center of the cylindrical shell, which may be made, for example, of metal or other material of sufficient strength. A centering pin 24 is then pushed up into the center of the sample, pushing the sample 22 into contact with the inner surface of the shell. The mold, containing the shell, is then frozen e.g., in a nitrogen environment) or otherwise caused to reversibly bond the sample to the shell. Once frozen, the centering pin is removed from the center of the sample, and then the shell, now containing the thin annular layer of the sample frozen to its inner surface, can be removed from the mold.

The above method allows sample amounts to be reproducibly controlled. In addition, the annular layer of sample can be made as thin or thick as desired. In particular, it may be desirable to make the layer thin so as to be able to quickly adjust sample temperature under various conditions. For example, a very thin layer is desirable when cooling the sample to ultra-low temperatures, where thermal conductivities can become very low, thus impeding uniform equilibration to ultra-low temperature (ULT). In addition a thin layer is useful for controlled, uniform and rapid, warming after polarization, which may benefit transfer to conditions of storage and is necessary for ultimate applications in imaging near room or body temperature.

Figure 3:
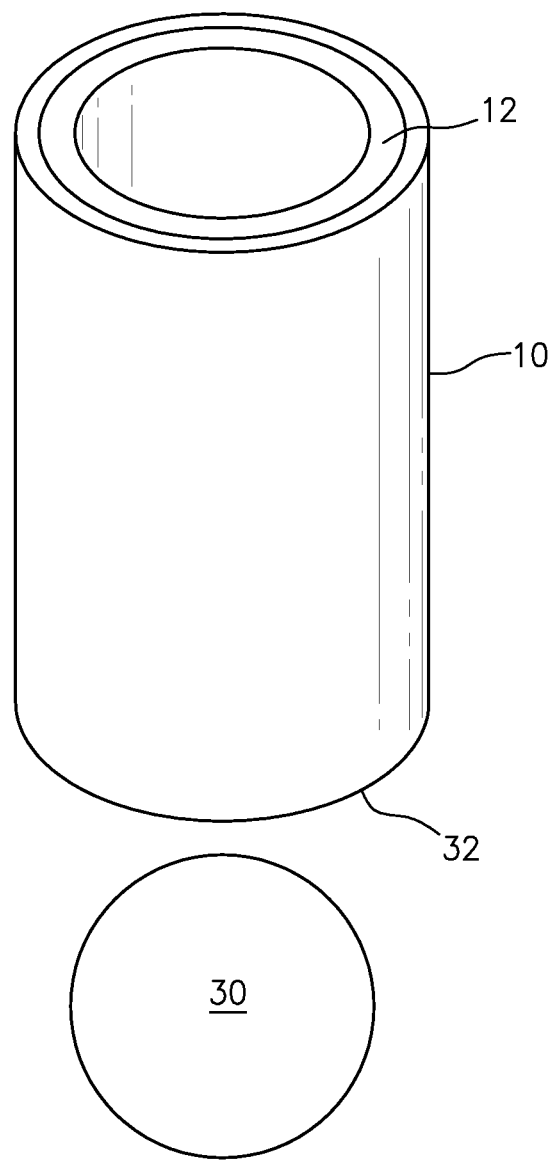
FIG. 3 is a pictorial illustration of the shell containing the frozen sample along the interior wall of the shell, and a wad.

A thin layer of sample is less compatible with rapid sample ejection, as application of gas may simply pass through the hole in the center and not move the shell out of the polarizing cryostat. Accordingly, a volume (e.g., a "wad") may be placed beneath the shell to aid in rapid expulsion and still allow for the sample itself to be a thin annular layer. FIG. 3 is a pictorial illustration of the shell 10 containing the frozen sample 13 along the interior wall of the shell, and a wad 30. The wad 30 may contact an axially proximate end 32 of at least one of the shell 10 or the sample 12. In one embodiment, the wad 30 may be made of a lightweight material with a large cross-sectional area, such as for example, a Teflon sphere (e.g., hollow, non-hollow or solid). Other embodiments include shaping the wad in the form of a bullet, e.g., rounded at the top, flat at the bottom, with an optional hole drilled through the middle. The hole through the middle may be of various cross sectional areas to suit desired applications such as decreasing or minimizing, or increasing or maximizing the flow of gas needed to eject the sample from the polarizer at a desired speed. It may also be made of various materials, both insulating and conducting, as desired.

The shell itself can be made from a variety of materials, including magnetic and non-magnetic materials. For example, in one embodiment the shell is made from stainless steel. Stainless steel has well-understood thermal properties at ULT, is resistant to corrosion and is structurally robust enough to withstand extreme conditions of temperature and mechanical stress. It can also be largely non-magnetic, which may be important if the shell is being expelled from a large ambient magnetic field. However, it is contemplated that the shell may also be formed from materials such as for example sapphire, ceramic, gold-plated copper, or some other material. Currently, an embodiment of the bonding between the sample and the shell is freezing, but other bonding technologies include pressure bonding, epoxy, et cetera. In addition, although one embodiment of the wad is Teflon, it contemplated that it may be formed from G-10, aluminum, or some other material, and in a different geometrical configurations such as for example, cylinder, cone, et cetera.

A goal of a cryogenic polarization system is to polarize spins within various molecules through the use of low temperatures and high magnetic fields, and subsequently to eject the sample from the polarizer for use as a magnetic resonance imaging (MRI) agent. Various aspects of these processes benefit from the sample geometry described herein. These include achieving a uniform ULT (e.g., <100 millikelvin) throughout the sample during polarization, a uniform low or intermediate temperature during its ejection or transfer, and rapid melting prior to ultimate use of the sample as an imaging agent. In addition to the uniform temperature, the sample geometry and ejection process are designed for controlled speed and profile of magnetic field experienced upon ejection, in order to preserve the polarization gained in the cryogenic polarization system.

A sample molecule may be $^{13}C$ enriched pyruvic acid. Because the thermal conductivity and heat capacity of pyruvic acid and many other molecules are unknown, especially in the ULT regime, the present design mitigates the time required for heat transfer during cooling to ULT. The thin cylindrical shell provides a large surface-to-volume ratio to encourage rapid uniform cooling. However, this thin shell needs to be inserted into the polarization system, and be robust enough to survive rapid ejection (e.g., up to 20 m/s) from the polarizer to a melting/dissolution or storage device. To keep the sample from breaking apart, the sample is bonded (e.g., frozen) to the inner wall of a small cylinder of metal or other material, i.e., the "shuttle or shell". The shell provides physical strength to protect the sample during shuttling in and out of the polarizer. Referring again to FIG. 1, the sample may be frozen to a radially interior surface of the shell, which may for example be about 8 mm long. The wall thickness of the shell may be about 0.010" thick, and the wall thickness of the frozen sample molecule may be about 0.016" thick. The outer diameter of the shell is about 0.1875", and the inner diameter is about 0.1675". One of ordinary skill in the art will appreciate, and it is contemplated, that in addition to the shape of the shell, the size of the shell can take on various sizes dependent on the equipment that is being utilized with and the amount of sample. The outer diameter of the frozen sample molecule may be about 0.1675", and the inner diameter about 0.1355". This geometry provides the desired thermal properties for efficiency and reliability of both cooling and melting/dissolution. However, it also presents a relatively small cross-sectional area perpendicular to the cylindrical axis. This may require a further feature in order to enable rapid propulsion of the sample from the polarizer via a gas stream. The amount of gas needed to eject the shell containing the sample is inversely proportional cross sectional area presented to the gas stream. Likewise the speed of ejection is directly proportional to this cross sectional area. On its own, the slight cross section of the cylindrical sample geometry would require excessive flow for rapid ejection. A solution is to place the wad (e.g., spherical) behind the sample to provide the needed cross-sectional area.

Rather than spherical, the wad may for example be a Teflon bullet, rounded at the top (its interface with the shuttle), but flat at the bottom. This avoids the potential for conversion of translational kinetic energy into wasted rotational degree of freedom in a spherical wad. Furthermore, various hole sizes may be drilled along the long axis of a bullet-shaped wad to allow variable cross-sectional presentation, and to enable gas flow through to the shell center and the sample as desired. The latter may be of use for more flexible speed and temperature control in the polarizer or during ejection. This is applicable beyond the primary application of producing hyperpolarized imaging agents. Both sample and wad designs may be more widely used in any application where one needs to quickly move a sample in and out of a cryogenic system. A feature of this design is that it allows one to reduce or minimize the amount of gas needed to propel the shell containing the sample. At the same time, the design provides a very thin, high surface-to-volume sample to ensure rapid equilibration of the entire sample to cryogenic temperatures, especially in the ULT regime where heat transfer properties are often uncertain. For example, the large surface area may be exposed to a cold helium mixture on its inner face, and on its outer surface, to a cold material with well-known heat-transfer properties, such as stainless steel. One of ordinary skill in the art will appreciate, and it is contemplated, that the wad may be of various shape and size, in order to assist in discharging the shell containing the sample.

A mold system with centering pin to block distribution of the sample into the center of the cylinder may be used to form the cylindrical sample on the shell. A liquid, solution-state or powder-form sample is placed in the center of the metal cylinder, and the centering pin is then pushed up into the sample which resides in the shell. The centering pin distributes the sample into close contact with the inner surface of the shell. The entire mold may be frozen or subjected to other transformative conditions (e.g., pressure, heat, electrical manipulation) to bond the sample to the shell. Once transformed in such a manner, the centering pin may be removed from the sample, and then the sample and shell are removed from the mold. This system and process creates a thin cylindrical sample. Modification of the pin diameter will allow easy variation of the sample volume and/or cross-sectional presentation, including to the extreme of an absent pin, where one may fill the entire center of the cylindrical shuttle with sample and avoid requirements for a wad.

While various embodiments of the present invention have been disclosed, it will be apparent to those of ordinary skill in the art that many more embodiments and implementations are possible within the scope of the invention. Accordingly, the present invention is not to be restricted except in light of the associated claims and their equivalents.

What is claimed is:

1. A carrier for a sample of highly polarized material including highly polarized nuclear spins, comprising:
   a cylindrical shell having a radially exterior surface and a radially interior surface;
   an annular layer of highly polarized frozen material interiorly adjacent to the radially interior surface; and
   a wad that forms a volume and contacts an axially proximate end of at least one of the shell or the sample, where the wad comprises a Teflon sphere,
   where the annular layer of highly polarized material is co-axial with the cylindrical shell and frozen to the radially interior surface.

2. The carrier of claim 1, wherein the shell is constructed substantially of non-magnetic material.

3. The carrier of claim 1, wherein the shell consists of non-magnetic material.

4. The carrier of claim 1, wherein the shell is constructed substantially of plastic material.

5. The carrier of claim 1, wherein the shell is constructed primarily of a polycarbonate.

6. The carrier of claim 1, where the shell is stainless steel.

7. The carrier of claim 1, wherein the annular layer of highly polarized frozen material comprises a methyl rotor group material.

8. The carrier of claim 1, wherein the annular layer of highly polarized frozen material comprises pyruvic acid.

9. The carrier of claim 1, wherein the annular layer of highly polarized frozen material comprises acetic acid.

10. The carrier of claim 1, wherein the wad comprises a solid Teflon sphere.

11. The carrier of claim 1, wherein the wad has a cross sectional area taken along the axial direction of the shell that is larger than the shell cross area sectional area and sample cross sectional area taken along the axial direction.

12. The carrier of claim 1, wherein the wad is hollow.

13. A carrier for a sample of highly polarized material including highly polarized nuclear spins, comprising:
   a cylindrical shell having a radially exterior surface and a radially interior surface;
   a cylindrical annular layer of highly polarized frozen material comprising a methyl rotor group molecule interiorly adjacent to and bonded to the radially interior surface; and
   a wad that forms a volume and contacts an axially proximate end of at least one of the shell or the sample, where the wad comprises a Teflon sphere, where the cylindrical annular layer of highly polarized frozen material is co-axial with the cylindrical shell and frozen to the radially interior surface.

* * * * *